United States Patent [19]

Höhne

[11] Patent Number: 4,457,540
[45] Date of Patent: Jul. 3, 1984

[54] MULTICOLOR PRINTED PRODUCT CONTAINING PEARL LUSTER PIGMENT

[75] Inventor: Dieter Höhne, Vendersheim, Fed. Rep. of Germany

[73] Assignee: Druckerei Gorius, Vendersheim, Fed. Rep. of Germany

[21] Appl. No.: 331,926

[22] Filed: Dec. 17, 1981

Related U.S. Application Data

[63] Continuation-in-part of Ser. No. 151,915, May 21, 1980, abandoned.

[30] Foreign Application Priority Data

May 22, 1979 [DE] Fed. Rep. of Germany ....... 2920647

[51] Int. Cl.³ ............................................. G09F 19/12
[52] U.S. Cl. ..................................... 283/94; 283/114; 40/427; 106/291; 428/195; 430/11
[58] Field of Search .......................... 428/195; 40/427; 430/11; 283/94, 114; 106/291

[56] References Cited

U.S. PATENT DOCUMENTS 3,493,410  2/1970  Morita et al. .................. 106/297 X
4,038,099  7/1977  DeLuca et al. ..................... 106/300

OTHER PUBLICATIONS

Yule, Principles of Color Reproduction, Wiley and Sons, N.Y., (1967).

Primary Examiner—John D. Welsh
Attorney, Agent, or Firm—Peter K. Kontler

[57] ABSTRACT

A multicolor printed product includes a base and a plurality of color component images printed on the base in superimposition upon one another. An additional image including a pearl luster pigment is superimposed upon the color component images, preferably adjacent to the uppermost color component image. The pigment is applied more heavily at those areas of the composite image consisting of the color component images which correspond to lighter areas of the composite image, and such pigment is applied less heavily at areas corresponding to rich color areas of the composite image. The printing plates which are used for the printing of the color component and pearl luster images are manufactured with the aid of films obtained by photographing the original in the component colors or by copying from at least one of the color component films. The manufacture of the pearl luster film involves photographic reversal procedure relative to the color component films.

6 Claims, 2 Drawing Figures

Fig.1
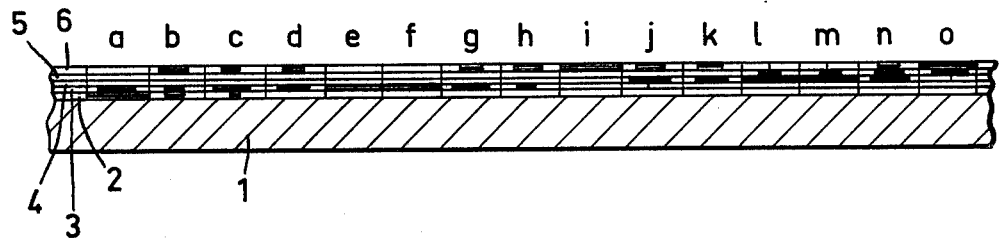
Fig.2

MULTICOLOR PRINTED PRODUCT CONTAINING PEARL LUSTER PIGMENT

CROSS-REFERENCE TO RELATED CASE

This is a continuation-in-part of my copending U.S. patent application Ser. No. 151,915 filed May 21, 1980, now abandoned.

BACKGROUND OF THE INVENTION

The present invention relates to a multicolor printed product with a base which carries on top of one another a plurality of color mosaic images of a color set, especially a blue, yellow, red, and possibly black, color image.

It is known to print images by applying to a base a plurality of colors of a color set, namely blue (cyan), yellow, red (magenta) and possibly black (depth), in a corresponding distribution. For instance, each color image may consist of a multitude of mosaic dots. The color distribution in each individual image depends on the magnitude of the individual mosaic dots. The light color of the base, especially a base consisting of white paper, constitutes the lighter zones of the image in that no dots or only small mosaic dots are printed thereat.

When printing plates for the various color images are to be manufactured for use in offset printing, one proceeds by making color extracts from the original in the form of black-and-white positive films. This is accomplished by photographing the original with the aid of interposed complementary color filters. The resulting positive films can be directly provided with the mosaic; however, they can also be produced as halftone color extracts, from which the mosaic positive films are then produced. These mosaic positive films serve for the exposure of the offset printing plates in such a manner that the black parts of the positive film later serve for the color transfer. Reference may be had to pages 189–194 of "The Printing Industry" by Victor Straus, published by Printing Industries of America Inc., Washington, D.C. 20015 (Library of Congress Catalog Card Number 67-26209). Reference may also be had to pages 114 to 144 of the German-language publication entitled "Offsettechnik" by Ing. Hermann Rittweger (Third Edition published by Fachschriften-Verlag, Fellbach near Stuttgart, Federal Republic Germany). It is also known to expose the offset printing plates by means of negative films. Similar methods are in existence not only for surface printing, but also for relief and intaglio printing.

It is further known to add a pearl luster pigment to printing dyes in order to give these dyes a certain luster. However, the printed products manufactured in this manner leave much to be desired in terms of brilliancy of the composite image.

OBJECTS AND SUMMARY OF THE INVENTION

An object of the present invention is to provide a multicolor printed product which bears a composite printed image on a base and does not exhibit the disadvantages of conventional printed products of this type. More particularly, it is an object of the present invention to provide a printed product wherein the multicolor composite image on the base can be readily and reliably accentuated by the use of a pearl luster pigment.

Another object of the present invention is to provide a simple method of manufacturing printing plates which can be used for the printing of color component and pearl luster images on the base in such a manner that the printing plate supplies the desired amounts of pearl luster pigment to those areas of the composite image which are to be accentuated or brightened.

One feature of the invention resides in the provision of a multicolor printed product which comprises a base (especially a light-color base) and a composite image on the base. The composite image includes a plurality of color component images superimposed upon one another on the base and each having a color distribution corresponding to the contribution of the respective color component image to the color of the composite image, and an additional component image which is at least partially transparent and includes pearl luster pigment. The additional image is superimposed upon the color component images on the base (especially next to the uppermost one of the color component images) and its pigment distribution is such as to accentuate predetermined areas of the composite image. It is particularly advantageous when the colors in the color component images and the pigment in the additional image are distributed in accordance with a mosaic pattern and the distribution of the pigment in the additional image is such that more pigment is present at those areas of the composite image which correspond to lighter areas of at least one (particularly the uppermost one) of the color component images than at the areas which correspond to darker areas of the one (uppermost) color component image.

In this manner, there is obtained a printed composite image having a pronounced contrast effect and brilliance. The pearl luster pigment increases the brightness of the area in question, be it the brightness of the base or the brightness of a color image, particularly when the latter contains a light dye. In this manner, the contrast richness of a composite image can be increased not only by the use of a dark color, such as black, but also by the use of the pearl luster pigment image.

What is important here is that the pearl luster effect is not uniformly distributed over the entire composite image but rather that it serves to accentuate the light zones and halftones.

In this manner, it is possible to excellently reproduce, by resorting to a printing technique, even mirror and metal luster effects. The additional image is preferably adjacent to the uppermost color image in order to ensure a pronounced exposed surface effect and also that the additional image is not covered by the remaining color images.

A particularly pronounced contrast effect is achieved when the additional image is located below the uppermost image because this enhances the optical prominency of those parts of the additional image which are not covered by the uppermost color image. This is especially true when the uppermost color image is black.

A synthetic silvery white pearl luster pigment on the basis of potash mica with a coating of titanium dioxide is especially recommended for inclusion in the pearl luster image. This pigment can be manufactured with a high luster effect and its white color augments the light base. However, other known pearl luster pigments, for instance, basic lead carbonate, can be used with equal or similar advantage.

The uppermost color component image or the pearl luster image can further contain transparent white color as a dye. The pearl luster pigment and the light color of the base are then especially effective in the representation of light areas of the composite image.

According to another aspect of the present invention, which involves the method of manufacturing printing plates for use in the printing of composite multicolor images consisting of superimposed component images on a base, particularly of the type wherein films are made from an original for the component images in accordance with the contribution of each component image to the composition of the image, and images to be printed are formed on the respective printing plates from the films, an additional film is made for use in the making of an additional printing plate to be used to print a pearl luster layer or image on the base. The additional film is used in the same or in a similar way as the other films for forming the images to be printed on the additional plate. In this respect, it is particularly advantageous when the step of making the additional film includes photographically reversing the density of the image on the additional film relative to the images on the other films.

As a result of the reversal procedure, the pearl luster image is applied more heavily at those zones at which lighter zones or halftones are present in the original. A separate photograph can be taken of the original for the production of these films; however, films which have been produced for the color component images can also be used as the starting point. The additional film can be produced by means of a color extract or it can correspond to a black-and-white photograph.

In particular, the film for the additional image is produced by using the color extract of a contrast-rich color. The additional image is applied more heavily at those places where the contrast-rich color has a lower intensity. Especially contrast-rich colors lie in the range of blue, brown, black or the like. By selecting different color extracts, it is also possible to achieve different image effects.

In a particularly simple case, the film for the additional image is produced by using the color extract for the blue color.

Furthermore, the film for the additional image can be corrected by taking into consideration the color extracts for the other colors of the original.

For instance, it is to be recommended to correct the film at those places where a pronounced red proportion or a pronounced yellow proportion is encountered, in such a manner that the pearl luster image is applied less heavily at these areas.

In an offset printing process in which positive films for the individual color images are produced by resorting to the technique of color extract, it is recommended that a negative film be produced for the additional image. This negative film can be exposed directly from the original or by copying from a positive film.

In the simplest case, the negative film is produced by copying from the blue positive film. When the last-mentioned film is already formed with the mosaic, the obtained negative film is already in its readily usable form.

For a correction, it is recommended that the negative film be produced by superimposed copying of at least two halftone positive films. Additional effects can be achieved during the superimposed copying by using different exposure times.

A further possibility for correction resides in that a halftone negative film is produced first, such film is corrected as to its tone values, and a mosaic negative film is produced therefrom. Various artistic effects may be achieved in a lithograph by resorting to such tone value corrections.

To summarize, the improved method of manufacturing printing plates for use in color-press printing of multi-color prints consisting of superimposed color component images on a base can be said to comprise the steps of making from an original a first film in accordance with the contribution of each of the color component images to the composition of the multicolor composite image; forming from each such first film, on a discrete plate of a set of printing plates, an image which is representative of the image to be applied by the respective plate; making from the original an additional or second film (preferably a negative film) and photographically reversing the density of the image on the second film relative to the images of the first films; and using the second film to form, on an additional printing plate, an image representing the dots to be applied in light-transmitting pearl luster to one of the color component images which are applied by the aforementioned set of (for example, four) printing plates. The making step can include correcting the second film in dependency on at least some color extracts other than the contrast-rich color extract.

The novel features which are considered as characteristic of the invention are set forth in particular in the appended claims. The improved print itself, however, both as to its composition and the method of making the same, together with additional features and advantages thereof, will be best understood upon perusal of the following detailed description of certain specific embodiments with reference to the accompanying drawing.

BRIEF DESCRIPTION OF THE DRAWING

FIG. 1 is a diagrammatic cross-sectional view of a printed product embodying one form of the present invention; and FIG. 2 is a view similar to that of FIG. 1 but showing a slightly modified printed product.

DESCRIPTION OF THE PREFERRED EMBODIMENTS

Referring first to FIG. 1, the printed product which is illustrated therein includes a base 1, preferably of paper, carrying a black color image 2, a blue color image 3, a red color image 4, a yellow color image 5, and an additional image 6 including pearl luster pigment. While the images 2 to 6 have been illustrated as being arranged in separate layers, this is not necessarily true under actual circumstances. Rather, and especially when each of the images 2 to 6 consists of dots of different sizes distributed over the image in a pattern reflecting the color composition of the composite image consisting of the color component images 2 to 6, no such discrete and continuous layers will be present. However, the illustration of the images 2 to 6 in the form of such layers may be helpful in understanding the following explanation. The images 2 to 6 can be printed, for instance, in a five-color machine in the aforementioned sequence. The printing of images 2 to 6 can also take place in a two-color machine in the course of three consecutive runs.

The additional image 6 can have, for instance, the following composition:
100 g transparent white;
100 g printing varnish;

50 g pearl luster pigment on the basis of potash mica coated with titanium dioxide; and Iris oil for thinning.

It is assumed that the exemplary embodiment of FIG. 1 is an offset print in which the color images 2 to 5 are applied by printing plates having mosaic points or dots which have been obtained with the aid of positive films produced via color extracts. Reference may be had to Chapter III, Section 4 and Chapter IV, Section 3 of the aforementioned book by Strauss. The additional image 6 is applied by means of a printing plate which has been obtained with the aid of a negative film produced via a color extract. To achieve this, it is possible to use the color extract for the blue color and, subsequently thereto, corrections may be made taking into consideration the color extracts for the black and red colors.

This results in the printing of mosaic dots of different magnitudes at locations a to o. In order to be able to better illustrate these dots, they have been shown in FIG. 1 as being positioned exactly one above the other. At the locations e and f, the blue coloration amounts to 100%. Consequently, in the additional image 6, no mosaic dot is present. A similar situation exists at the location a where, while the blue mosaic dot amounts to a mere 60%, there is, however, a 100% black coverage. At the locations d, g and h, the magnitude of the mosaic dot in the additional image 6 is complementary to the magnitude of the mosaic dot in the blue color image 3. This is also true with respect to the location c where the black correction is negligibly small. At the location b, the mosaic dot of the additional image 6 is somewhat smaller, due to the correction by the black color, than that which would correspond to the complementary value of the mosaic dot in the blue color. At the location i, there is not provided any color mosaic dot at all in any of the images 2 to 5; accordingly, a 100% mosaic dot results for the additional image 6. This is also valid for the location o where only a yellow mosaic dot, which is not utilized for the correction, and a negligibly small red mosaic dot, are present. At the locations i to n, the magnitude of the mosaic dots of the additional image 6 is reduced despite the absence, or only a small size, of the blue mosaic dots. This is attributable to the correction with red color.

FIG. 2 shows a paper base 11 which is provided with a blue color image 12, a yellow color image 13, a red color image 14, an additional image 15 containing pearl luster pigment, and a black color image 16. The preceding explanation with respect to the arrangement of the images in coherent layers is equally applicable here with respect to the images 12 to 16. The films of a color set from which the printing plates or other printing elements to be used for the printing of the images 12 to 16 are manufactured are produced in a direct mosaic-making operation, in which the four colors are converted into the mosaic or raster already during the making of the color extract. For the additional image 15, there was made a halftone extract which was corrected, in accordance with its motif, as to its tone value and which was subsequently also converted into a mosaic. Herein, it is possible to very exactly consider the motif; yet, there exists no danger that the mosaic dot would be corroded.

The size of the mosaic dot of the additional image 15 varies in a pronounced dependence on the dot sizes of the other color images 12 to 14 and 16. At those locations where a pronounced coverage is provided by other colors (location c) or by a 100% black mosaic dot (location o), there is no mosaic dot in the additional image 15. At those locations where no other color is applied (location m), there is a 100% mosaic dot in the additional image 15. The blue color extract (location a) has a more pronounced influence on the additional image 15 than the yellow color extract (location h).

In this manner, one can also provide for the production of color extracts for the manufacture of the color set by means of halftone films which are subsequently provided with the mosaic and corrected. A further film is then produced from these halftone films by superimposed copying on a negative film material, in which the dark areas of the image being copied become light and the light areas become dark. Thereafter, even this negative film is provided with the mosaic and also possibly partially corrected. Even here, it is possible to accurately take the motif into consideration, without running the risk that the mosaic dots will be corroded or otherwise obliterated.

The aforementioned correction during the production of the film for the additional image 15 is not necessary when the subject matter in question involves predominantly light-colored areas or images, or such areas which exhibit pronounced contrasts between the light and the dark regions. Under these circumstances, it is sufficient to produce a negative from the blue positive film of the color set by resorting to simple copying on a negative film.

When the printed products are to be printed in accordance with other printing techniques, one can proceed in an analogous manner. Then, the sizes of the dots illustrated in FIGS. 1 and 2 would constitute mere representations of the color densities of the component colors present in the images 2 to 6 or 12 to 16 which, in this instance, would indeed constitute separate and continuous superimposed layers. Various printing processes and methods are outlined in Chapter I of the aforementioned book by Strauss (this Chapter includes a Section 4 a part of which deals specifically with offset lithography as one of the planographic printing techniques. Various image carriers for offset lithography are discussed in Chapter 4, Section 5, and various printing inks are described in Chapter IX of the aforementioned book by Strauss. For the sake of simplicity and brevity, all relevant passages of this book are incorporated herein by reference).

It will be seen that the improved print comprises a base and a plurality of superimposed different color component images which are applied to the base and include two adjacent upper or outermost color component images (5, 6 or 15, 16). The improved print further comprises an additional image which is at least partially transparent and includes a pearl luster pigment. Such additional image is applied over one of the two outer or upper color component images and its pigment is distributed with a view to accentuate predetermined areas of the composite image, preferably in such a way that more pigment is present in the lighter than in the darker areas of the composite image.

The colors in the color component images and the pigment in the additional image can be distributed in accordance with a mosaic pattern. The additional image can be applied over the outermost or over the next-to-the-outermost color component image. The color of the base is preferably lighter than the color of at least one of the (preferably three or four) color component images.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of my contribution to the art and, therefore, such adaptations should and are intended to be comprehended within the meaning and range of equivalence of the appended claims.

I claim:

1. A multi-color print, comprising a base; a plurality of superimposed different color component images applied to said base and including two adjacent outermost color component images, each of said images having a color distribution in accordance with a mosaic pattern and corresponding to the contribution of the corresponding color component image to the composite image resulting from said plurality of color component images, said composite image having lighter and darker areas; and an additional component which is at least partially transparent and includes white pearl luster pigment, said additional component being applied over one of said outermost color component images and its pigment being distributed in accordance with a mosaic pattern and in such a way that more pigment is present in the lighter than in the darker areas of said composite image.

2. The print of claim 1, wherein said one outermost color component image constitutes the inner image of said two outermost color component images.

3. The print of claim 1, wherein said one outermost color component image constitutes the outer image of said two outermost color component images.

4. The print of claim 1, wherein said pigment is a synthetic pearl luster pigment based on potash mica coated with titanium dioxide.

5. The print of claim 1, wherein said additional component includes transparent white ink.

6. The print of claim 1, wherein the color of said base is lighter than the color of at least one of said color component images.

* * * * *